(12) United States Patent
Uduebho et al.

(10) Patent No.: US 9,104,635 B2
(45) Date of Patent: Aug. 11, 2015

(54) MEMORY TIMING OPTIMIZATION USING PATTERN BASED SIGNALING MODULATION

(75) Inventors: Oseghale O. Uduebho, Tumwater, WA (US); Adam J. Norman, Forest Grove, OR (US)

(73) Assignee: Intel Corporation, Santa Clara, CA (US)

( * ) Notice: Subject to any disclaimer, the term of this patent is extended or adjusted under 35 U.S.C. 154(b) by 125 days.

(21) Appl. No.: 13/993,010

(22) PCT Filed: Dec. 28, 2011

(86) PCT No.: PCT/US2011/067549
§ 371 (c)(1),
(2), (4) Date: Jun. 10, 2013

(87) PCT Pub. No.: WO2013/100956
PCT Pub. Date: Jul. 4, 2013

(65) Prior Publication Data
US 2014/0059318 A1    Feb. 27, 2014

(51) Int. Cl.
*G06F 13/16* (2006.01)
*G11C 29/02* (2006.01)

(52) U.S. Cl.
CPC .......... *G06F 13/161* (2013.01); *G06F 13/1689* (2013.01); *G11C 29/023* (2013.01); *G11C 29/028* (2013.01)

(58) Field of Classification Search
None
See application file for complete search history.

(56) References Cited

U.S. PATENT DOCUMENTS

| | | | |
|---|---|---|---|
| 7,095,661 B2 * | 8/2006 | Osaka et al. | 365/194 |
| 8,588,014 B1 * | 11/2013 | Fung et al. | 365/194 |
| 2005/0216799 A1 | 9/2005 | Azimane | |
| 2005/0249001 A1 | 11/2005 | Tanaka et al. | |
| 2011/0249522 A1 | 10/2011 | Welker et al. | |
| 2012/0089857 A1 * | 4/2012 | Sharma et al. | 713/503 |

OTHER PUBLICATIONS

"PCT Notification of Transmittal of the International Search Report and the Written Opinion of the International Searching Authority, or the Declaration", dated May 2, 2012, for International Application No. PCT/US2011/067549, 8pgs.
"Notification Concerning Transmittal of International Preliminary Report on Patentability Chapter 1 of the Patent Cooperation Treaty", Jul. 10, 2014, for International Application No. PCT/US2011/067549, 5pgs.

* cited by examiner

*Primary Examiner* — Gary Portka
(74) *Attorney, Agent, or Firm* — Buckley, Maschoff & Talwalkar LLC

(57) ABSTRACT

According to some embodiments, a method and apparatus are provided to determine a worst-case setup and hold bit pattern stream associated with a load on a bus, and determine a time shift to apply to an incoming bit pattern being conveyed relative to a DLL associated with the load.

17 Claims, 3 Drawing Sheets

100

Determine a worst-case setup and hold bit pattern stream associated with a load on a bus
101

Determine a time shift to apply to an incoming bit pattern being conveyed relative to a DLL associated with the load based on the determined worst case setup and hold bit pattern stream
102

Transmit a time modulated incoming bit pattern to the load on the bus based on the determined time shift
103

100

```
┌─────────────────────────────────────────────┐
│ Determine a worst-case setup and hold bit   │
│ pattern stream associated with a load on a bus │
│                                         101 │
└─────────────────────────────────────────────┘
                      │
                      ▼
┌─────────────────────────────────────────────┐
│ Determine a time shift to apply to an incoming │
│ bit pattern being conveyed relative to a DLL   │
│ associated with the load based on the determined│
│ worst case setup and hold bit pattern stream   │
│                                         102 │
└─────────────────────────────────────────────┘
                      │
                      ▼
┌─────────────────────────────────────────────┐
│ Transmit a time modulated incoming bit pattern │
│ to the load on the bus based on the determined │
│ time shift                                  103 │
└─────────────────────────────────────────────┘
```

FIG. 1

MEMORY TIMING OPTIMIZATION USING PATTERN BASED SIGNALING MODULATION

BACKGROUND OF THE INVENTION

A delay-locked loop (DLL) is a digital circuit that can be used to change (e.g., modulate) a phase of a clock signal (e.g., a signal with a periodic waveform). A DLL is typically used to enhance a clock's timing of an integrated circuit (such as memory controller) to ensure that when a 1 is transmitted to a memory bank a 1 is received (e.g., latched) at the memory bank. If timing is off, a transmitted 1 could be received as a 0.

On a single or multi-load bus (e.g., a bus that serves multiple dynamic random access memory circuits), conventional systems seek to deploy a common DLL. In fly-by topology, a worst-case setup time on the load with the smallest electrical flight time from the memory controller and the worst-case hold time on the load with the largest electrical flight time from the memory controller may dictate significant DLL displacement if each pattern on each load is considered exclusively. As such, conventional methods place the common DLL midway between the low and high DLL limit for the load(s).

Current memory architecture, such as DDR3, may utilize training to determine a common DLL placement for a single or multi-load bus. However, the available timing margin for placing a common DLL diminishes when signaling at higher speeds.

BRIEF DESCRIPTION OF THE DRAWINGS

FIG. 1 illustrates a method according to some embodiments.

DETAILED DESCRIPTION OF EXAMPLE EMBODIMENTS

Referring now to FIG. 1, an embodiment of a method 100 is illustrated. The method 100 may relate to delaying or advancing a relative timing between the incoming bit pattern on the bus and the DLL circuit associated with a memory controller to ensure a greater timing margin on a single or multi-load bus. The method 100 may be performed by an apparatus such as that described with respect to FIG. 3 or by a memory controller such as that described with respect to FIG. 2 or FIG. 3. Furthermore, the method 100 may be embodied on a medium such as a multi-purpose register ("MPR") which can be preloaded with a limited set of bit patterns that may be used to calibrate the relative advance/retard between an incoming bit pattern on a bus and a DLL associated with the memory controller.

At 101, a worst-case setup and hold bit pattern associated with a load on a bus is determined. In some embodiments, the worst-case setup and hold bit pattern may be determined for every load on the bus. The load may comprise a memory module. However, the load may also comprise any device capable of communicating via bus architecture. The bus may comprise a subsystem that transfers data between components within a computer system. A setup time comprises the minimum amount of time a data signal should be held steady before a clock event so that the data are reliably sampled by the clock. A hold time comprises the minimum amount of time the data signal should be held steady after the clock event so that the data are reliably sampled.

The worst-case bit pattern for setup and hold times may vary for a particular load and also each load on a multi-load bus. In other words, a worst-case setup pattern for a load may not be a worst-case hold pattern for that load and may also not be a worst-case setup/hold pattern for any additional loads on the bus. To improve a timing margin, the particular incoming bit pattern may be advanced or delayed for each load and thus, according to some embodiments, an MPR may be programmed with a list of load-pattern combinations and the corresponding timing modulation to apply to the particular incoming bit pattern for each load based on the associated worse-case bit pattern. In some embodiments, the memory controller can lookup each respective delay or advancement or the memory controller may receive each respective delay or advancement stored in memory such as non-volatile memory.

Figure 2:
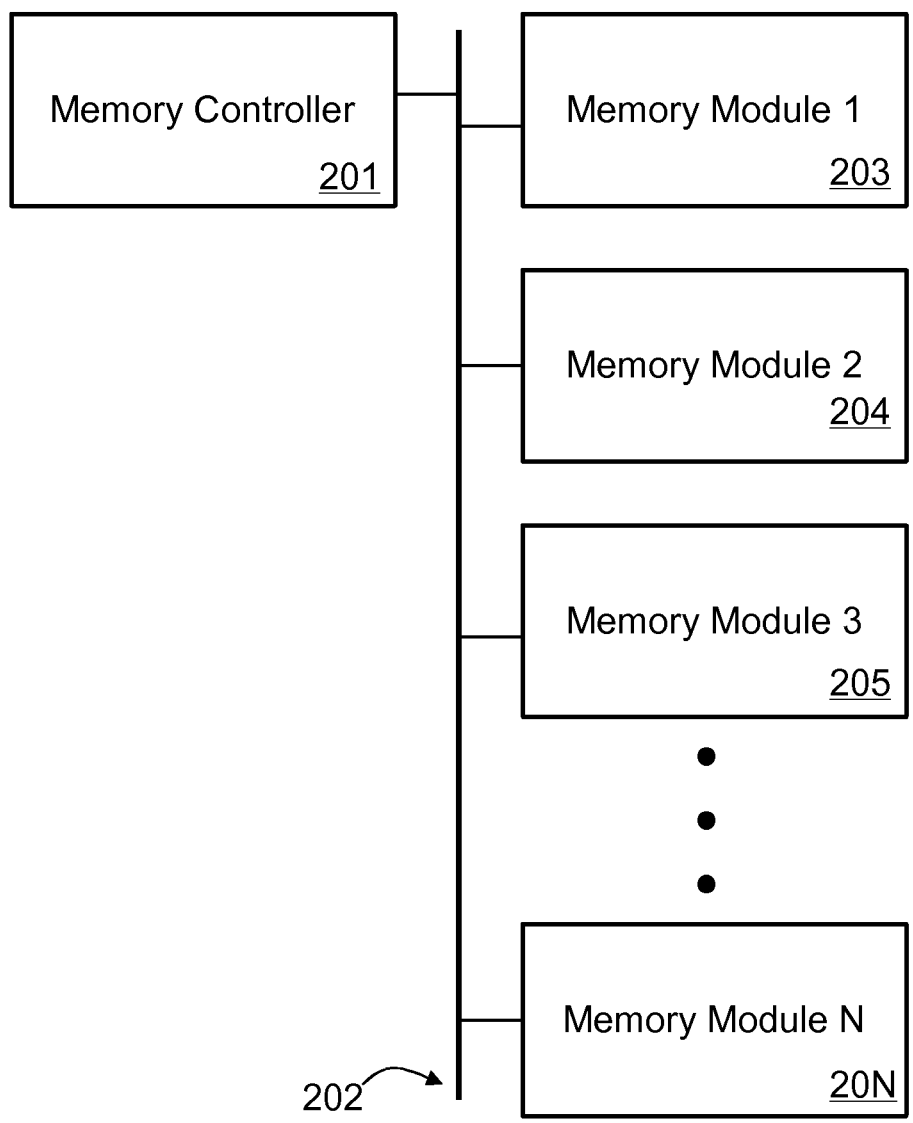
FIG. 2 illustrates a memory controller in communication with a plurality of loads according to some embodiments.

For illustrative purposes, and to aid in understanding features of the specification, an example will now be introduced. This example is not intended to limit the scope of the claims. For example, and referring to a system 200 as illustrated in FIG. 2, a memory controller 201 may control a plurality of memory loads 203/204/205/20N on a bus 202. In some embodiments, a processor (not shown in FIG. 2) may determine a worst-case bit pattern associated with each of the memory loads 203/204/205/20N. However, in other embodiments, the memory controller 201 may determine each worst-case bit pattern.

In some embodiments, set-up and hold patterns that are associated with a greatest amount of degradation of a timing margin (e.g., worst-case) for each memory module may be stored and tracked in a system's BIOS. Furthermore, the memory controller 201 may comprise circuitry associated with time-shift modulation of the transmitted data bits.

Referring back to FIG. 1, at 102, a time shift to apply to an incoming bit pattern being conveyed relative to a DLL associated with the load is determined based on the determined worst case setup and hold bit pattern stream. The timing change may be determined via a memory controller. The timing change may be a delay in time to the transmitted signal or advancement in time to the transmitted signal. The delay/advancement of transmitted data (e.g., bits) on a multi-load bus may be based on the determined prior estimation of a worst-case bit pattern stream for each load on the multi-load bus.

Continuing with the above example, a first data stream may be directed to memory module 204 and a second data stream may be directed to memory module 205. The relative DLL timing associated with the first data stream may be adjusted by a first amount and the relative DLL timing associated with the second data stream may be adjusted by a second amount where the first amount and the second amount are different amounts of time.

At 103, a time modulated incoming bit pattern is transmitted to the load on the bus based on the determined time shift. Continuing with the above example, the first data stream is transmitted to memory module 204 based on a first adjusted timing and the second data stream is transmitted to memory module 205 based on a second adjusted timing. The first data stream and the second data stream may each latch at their target load module with a high probability of accuracy.

Figure 3:
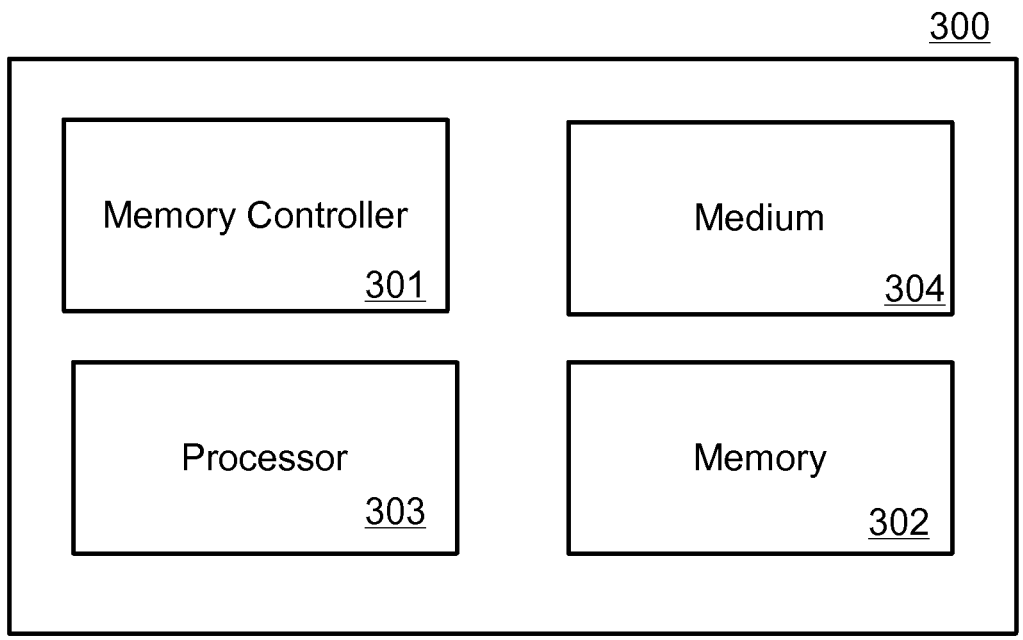
FIG. 3 illustrates an apparatus according to some embodiments.

Now referring to FIG. 3, an embodiment of an apparatus 300 is illustrated. The apparatus 300 may comprise a memory controller 301, a main memory 302, a processor 303, and a medium 304. According to some embodiments, the apparatus 300 may further comprise a digital display port, such as a port adapted to be coupled to a digital computer monitor, television, portable display screen, or the like.

The memory controller 301 may comprise a circuit which manages a flow of data going to and from the memory. In some embodiments, the memory controller 301 may comprise a separate chip. However, in other embodiments, the memory controller may be integrated into another chip, such as on a die of the processor 303.

The main memory 302 may comprise any type of memory for storing data, such as, but not limited to, a Secure Digital (SD) card, a micro SD card, a Single Data Rate Random Access Memory (SDR-RAM), a Double Data Rate Random Access Memory (DDR-RAM), or a Programmable Read Only Memory (PROM). The main memory 302 may comprise a plurality of memory modules.

The processor 303 may include or otherwise be associated with dedicated registers, stacks, queues, etc. that are used to execute program code and/or one or more of these elements may be shared there between. In some embodiments, the processor 303 may comprise an integrated circuit. In some embodiments, the processor 303 may comprise circuitry to perform a method such as, but not limited to, the method described with respect to FIG. 1.

The medium 304 may comprise any computer-readable medium that may store processor-executable instructions to be executed by the processor 303 and in some cases the memory controller 301 (e.g., the method 100). For example, the medium 304 may comprise a non-transitory tangible medium such as, but is not limited to, a compact disk, a digital video disk, flash memory, optical storage, random access memory, read only memory, or magnetic media.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Various modifications and changes may be made to the foregoing embodiments without departing from the broader spirit and scope set forth in the appended claims. The following illustrates various additional embodiments and do not constitute a definition of all possible embodiments, and those skilled in the art will understand that the present invention is applicable to many other embodiments. Further, although the following embodiments are briefly described for clarity, those skilled in the art will understand how to make any changes, if necessary, to the above-described apparatus and methods to accommodate these and other embodiments and applications.

What is claimed is:

1. A method comprising:
   determining, via a processor, a worst-case setup and hold time based on both a first load and a second load on a bus, wherein the worst-case setup and hold time is associated with (i) an amount of time a data signal is to be held steady before a clock event and (ii) an amount of time the data signal is to be held steady after the clock event, wherein the worst-case setup and hold time is further based on data stored in a BIOS;
   determining, via a memory controller, a time shift to apply to a first incoming bit pattern stream being transmitted to the first load, the incoming pattern stream being conveyed relative to a DLL associated with the first load and the second load wherein the time shift is based on the determined worst case setup and hold time, and wherein the first load and the second load are different loads on the bus; and
   transmitting a first time modulated incoming bit pattern stream to the first load on the bus based on the first determined time shift.

2. The method of claim 1, wherein the timing change is a delay in time.

3. The method of claim 1, wherein the timing change is an advancement in time.

4. The method of claim 1, further comprising:
   determining, via the memory controller, a second time shift to apply to a second incoming bit pattern stream being transmitted to the second load, the second incoming pattern stream being conveyed relative to the DLL associated with the first load and the second load wherein the second time shift is based on the determined worst case setup and hold time pattern and the second time shift is different than the first time shift.

5. The method of claim 1, wherein the determined time shift is based on a set of preloaded bit patterns to calibrate the time shift.

6. The method of claim 1, wherein the determined time shift is based on a list of load-pattern combinations and a corresponding timing modulation to apply to the incoming bit pattern.

7. The method of claim 1, further comprising:
   storing the first worst-case setup and hold time in the BIOS.

8. An apparatus comprising:
   a plurality of memory modules; and
   a memory controller, the apparatus to:
   determine a worst-case setup and hold time based on a first of the plurality of memory modules that receives a first bit pattern stream and a second of the plurality of memory modules that receives a second bit pattern stream on a bus, wherein the worst-case setup and hold time is associated with (i) an amount of time a data signal is to be held steady before a clock event and (ii) an amount of time the data signal is to be held steady after the clock event, wherein the first worst-case setup and hold time is further based on data stored in a BIOS; and
   determine a time shift to apply to the first incoming bit pattern stream being transmitted to the first of the plurality of memory modules, the incoming pattern stream being conveyed relative to a DLL associated with the first of the plurality of memory modules and the second of the plurality of memory modules wherein the time shift is based on the determined worst case setup and hold time; and transmit a first time modulated incoming bit pattern stream to the first of the plurality of memory modules on the bus based on the first determined time shift.

9. The apparatus of claim 8, wherein the time shift is a delay in time.

10. The apparatus of claim 8, wherein the time shift is an advancement in time.

11. The apparatus of claim 8, wherein the apparatus is further to:
determine a second time shift to apply to the second incoming bit pattern stream being transmitted to the first of the plurality of memory modules, the second incoming pattern stream being conveyed relative to the DLL associated with the first of the plurality of memory modules and the second of the plurality of memory modules wherein the second time shift is based on the determined worst case setup and hold time pattern and the second time shift is different than the first time shift.

12. An apparatus comprising:
a plurality of memory modules; and
a processor to:
determine a worst-case setup and hold time based on a both first of the plurality of memory modules that receives a first bit pattern stream and a second of the plurality of memory modules that receives a second bit pattern stream on a bus, wherein the worst-case setup and hold time is associated with (i) an amount of time a data signal is to be held steady before a clock event and (ii) an amount of time the data signal is to be held steady after the clock event, wherein the first worst-case setup and hold time is further based on data stored in a BIOS; and
determine a time shift to apply to the first incoming bit pattern stream being transmitted to the first of the plurality of memory modules, the incoming pattern stream being conveyed relative to a DLL associated with the first of the plurality of memory modules and the second of the plurality of memory modules wherein the time shift is based on the determined worst case setup and hold time; and
transmit a first time modulated incoming bit pattern stream to the first of the plurality of memory modules on the bus based on the first determined time shift.

13. The apparatus of claim 12, wherein the time shift is a delay in time.

14. The apparatus of claim 12, wherein the time shift is advancement in time.

15. A system, comprising:
a digital display port adapted to be coupled to a digital display
a plurality of memory modules;
a processor coupled to the digital display port, the processor to:
determine a worst-case setup and hold time based on both a first of the plurality of memory modules that receives a first bit pattern stream and a second of the plurality of memory modules that receives a second bit pattern stream on a bus, wherein the worst-case setup and hold time is associated with (i) an amount of time a data signal is to be held steady before a clock event and (ii) an amount of time the data signal is to be held steady after the clock event, wherein the first worst-case setup and hold time is further based on data stored in a BIOS; and
determine a time shift to apply to the first incoming bit pattern stream being transmitted to the first of the plurality of memory modules, the incoming pattern stream being conveyed relative to a DLL associated with the first of the plurality of memory modules lead and the second of the plurality of memory modules wherein the time shift is based on the determined worst case setup and hold time; and
transmit a first time modulated incoming bit pattern stream to the first of the plurality of memory modules on the bus based on the first determined time shift.

16. The system of claim 15, wherein the time shift is a delay in time.

17. The system of claim 15, wherein the time shift is an advancement in time.

* * * * *